United States Patent
Aberle et al.

(10) Patent No.: US 6,555,260 B2
(45) Date of Patent: Apr. 29, 2003

(54) FUEL CELL SYSTEM HAVING A FUEL CELL STACK WITH INTEGRATED POLARITY REVERSAL PROTECTION DIODE

(75) Inventors: Markus Aberle, Dettingen (DE); Anton Sonntag, Kirchheim (DE); Josef Sonntag, Kirchheim (DE)

(73) Assignee: Ballard Power Systems AG, Kirchheim/Teck-Nabern (DE)

( * ) Notice: Subject to any disclaimer, the term of this patent is extended or adjusted under 35 U.S.C. 154(b) by 163 days.

(21) Appl. No.: 09/849,449

(22) Filed: May 7, 2001

(65) Prior Publication Data
US 2002/0009624 A1 Jan. 24, 2002

(30) Foreign Application Priority Data
May 5, 2000 (DE) .......................... 100 21 907

(51) Int. Cl.⁷ .................. H01M 8/00; H01M 8/04; H01M 8/12
(52) U.S. Cl. .................. 429/26; 429/13; 429/24
(58) Field of Search ................ 429/13, 17, 20, 429/24, 25, 26

(56) References Cited

U.S. PATENT DOCUMENTS

| | | | | | |
|---|---|---|---|---|---|
| 5,156,928 A | * | 10/1992 | Takabayashi | ................. | 429/23 |
| 5,229,222 A | * | 7/1993 | Tsutsumi et al. | ............. | 429/19 |
| 5,366,820 A | * | 11/1994 | Tsutsumi et al. | ............. | 429/19 |
| 5,714,874 A | * | 2/1998 | Bonnefoy | .................... | 323/299 |
| 6,194,095 B1 | * | 2/2001 | Hockaday | .................... | 429/34 |
| 6,248,461 B1 | * | 6/2001 | Abe et al. | ...................... | 429/22 |

* cited by examiner

Primary Examiner—Carol Chaney
Assistant Examiner—Donald V. Scaltrito
(74) Attorney, Agent, or Firm—Crowell & Moring LLP

(57) ABSTRACT

A fuel cell system comprises a plurality of fuel cells arranged in a stack between two end plates. An electrical load is connected to the fuel cell stack via a load circuit, and a diode is arranged between the fuel cell stack and the electrical load in the load circuit. According to the invention, the diode is arranged directly on or in one of the end plates. Moreover, a cooling device, which is in thermal contact with the diode and dissipates the power loss from the diode, is provided in the region of the diode.

13 Claims, 2 Drawing Sheets

FUEL CELL SYSTEM HAVING A FUEL CELL STACK WITH INTEGRATED POLARITY REVERSAL PROTECTION DIODE

BACKGROUND AND SUMMARY OF THE INVENTION

This application claims the priority of German patent document 100 21 907.1, filed May 5, 2000, the disclosure of which is expressly incorporated by reference herein.

The invention relates to a fuel cell system having a plurality of fuel cells arranged in a stack between two end plates.

U.S. Pat. No. 5,714,874 discloses a fuel cell system in which a fuel cell stack is connected to an electrical load via a load circuit. Furthermore, a diode is provided in the load circuit between the fuel cell stack and the electrical load. In addition, a current transformer and a battery are integrated in the load circuit. The components in the load circuit are connected in series, so that the order of the components is unimportant.

The diode in the load circuit allows current to flow from the fuel cell stack to the electrical load, while preventing a reverse current from the electrical load into the fuel cell stack. A current flow in the direction opposite the intended flow direction of the fuel cell of this type (i.e., from the anode of the fuel cell stack to the cathode) would cause permanent damage to the fuel cell stack. One example of an electrical load which at the same time may also act as a generator is a converter for a driving motor in a fuel cell vehicle. In a braking mode (i.e., when the vehicle is being decelerated by the drive), a drive converter of this type can itself become a generator, and thus feed current into the load circuit.

The diode is usually electrically connected to the fuel cell stack via an electrical conductor, for example a busbar or a cable. This electrical conductor and the associated connecting element (i.e., a cable lug or plug) must be designed for the high fuel cell currents, and are therefore complex and expensive.

Furthermore, when current flows in the conducting direction in the pn junction of a diode, a voltage always remains in the diode. This forward voltage multiplied by the current passing through the diode results in a power loss which heats the diode. To prevent unacceptable temperatures from being reached in the diode, causing the latter to be destroyed, it is therefore necessary to provide cooling. This cooling may be realized by a liquid coolant or by means of air cooling. In the embodiment with liquid coolant, it must be ensured that a conductive connection is not produced between the anode and the cathode of the diode by the coolant, since otherwise the effect of the diode would be eliminated. In the air-cooled embodiment, a correspondingly large air heat sink has to be used. Under certain circumstances, to achieve sufficient dissipation of heat, forced ventilation by means of a fan is also required. When using ventilation, it is also necessary to ensure that dirt particles are not sucked in, which could combine with moisture present in the air, causing insulation problems on the intended leakage paths.

It is an object of the invention to provide a fuel cell system which is of simple design, functions reliably and has a load circuit in which a fuel cell stack, a diode and an electrical load are arranged.

This and other objects and advantages are achieved by the fuel cell system according to the invention, in which the diode is arranged on or in one of the end plates of the fuel cell stack. At the same time, a cooling device, which is in thermal contact with the diode, is provided in the end plate in the region of the diode. As a result, it is possible to dispense with an additional connection between diode and fuel cell stack, achieving a significant weight, cost, space and design advantage on account of the line cross sections which are required for the high fuel cell currents. The direct electrical connection of the diode to the end plates eliminates the need for electrical contact points, which may lead to contact and insulation problems.

At the same time, it is easy to ensure sufficient cooling of the diode, since a cooling device is usually already present in a fuel cell stack. Therefore, the cooling device which is present needs at most to be expanded slightly. Alternatively, the diode may also be arranged in the region of the cooling device which is already present. It is thus possible to dispense with a separate cooling device for the diode, which likewise constitutes a significant advantage in terms of weight, costs, space and design.

The diode may, for example, be in the form of a disc and is preferably releasably connected to the end plate with the aid of an attachment element. This simplifies installation and, if necessary, exchanging of the diode. The attachment element may also be releasably connected to the load circuit. In this way, it is possible for the attachment element at the same time to be used to bring one pole of the diode into intimate contact with the end plate and, at the same time, to allow simple connection of the load circuit to the other pole of the diode.

Arranging a thermally and/or electrically conductive intermediate layer between diode and end plate allows the thermal and/or electrical conductivity to be improved.

Integrating the semiconductor module of the diode directly in the end plate has the advantage that there is even less electrical power loss, on account of the low-resistance junction. Moreover, in this way it is possible to produce even better thermal coupling of the diode to the end plate. As a result, the thermal resistance is reduced, allowing a higher coolant temperature or a higher barrier junction temperature of the diode. Furthermore, during the integration the necessary electrical leakage paths are formed in the radial direction. Compared to installation on the end plate, this leads to a further advantage in terms of volume and design, since in this case the leakage paths have to be formed in the axial direction. Finally, it is possible to dispense with a separate housing for the diode, which in addition to saving costs also reduces outlay on production.

If the fuel cell stack already has cooling ducts, it is at most necessary to provide an additional duct in the region of the diode. Usually, the feed and discharge lines for the cooling system are also formed via one or both end plates. If, in this case, the diode is arranged in the region of a feed or discharge line of this type, the need for an additional cooling duct is eliminated.

Other objects, advantages and novel features of the present invention will become apparent from the following detailed description of the invention when considered in conjunction with the accompanying drawings.

DETAILED DESCRIPTION OF THE DRAWINGS

Figure 1:
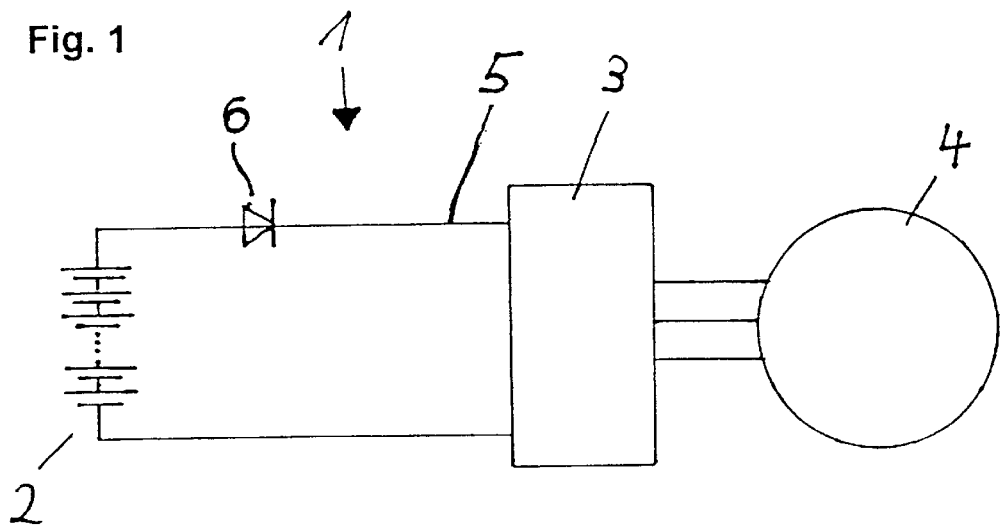
FIG. 1 shows a simplified circuit diagram of a fuel cell system.

In FIG. 1, the fuel cell system according to the invention, which is denoted overall by 1, contains a diagrammatically illustrated fuel cell stack 2 and an electrical load 3. This load may be, for example, the power converter of an electric drive motor 4. The fuel cell stack 2 and the electrical load 3 are connected to one another via a load circuit 5. Further junctions, for example connectors, battery circuit-breakers, etc., may also be present in this load circuit 5. Moreover, a diode 6 is provided in the load circuit 5, between the fuel cell stack 2 and the electrical load 3. Since this is a series connection, the order of the components is arbitrary.

If the fuel cell stack 2 (preferably a PEM fuel cell), is exposed to a hydrogen-rich gas (preferably hydrogen or a product gas from a reformer) on the anode side and to an oxygen-containing gas (preferably ambient air) on the cathode side, and the load circuit is closed by an electrical consumer, an electric current flows in the technical flow direction from the cathode of the fuel cell stack 2, via the anode of the diode 6, through the diode 6, from the cathode of the diode 6 to the electrical consumer 3 and then back to the anode of the fuel cell stack 2.

The diode 6 may be arranged at any desired point in the load circuit 5, provided that it allows current to flow from the fuel cell stack 2 to the electrical load 3 and, at the same time, prevents a reverse current from the electrical load 3 into the fuel cell stack 2. This protective arrangement is provided because a flow of current in the direction opposite the technical direction of flow of the fuel cell stack 2 of this type (i.e., from the anode to the cathode of the fuel cell stack 2), would cause permanent damage. To prevent this, the diode 6 is usually arranged in the load circuit 5, with in each case one electrically conductive connection being present between the anode of the diode 6 and the cathode of the fuel cell stack 2 and between the cathode of the diode 6 and the anode of the fuel cell stack 2.

Electrical consumers may operate either as electrical source or drain under different operating conditions. By way of example, a battery arranged in the load circuit 5 may, depending on the voltage position, either take up energy from the load circuit 5 in order to charge the battery or release energy from the battery into the load circuit 5. Another example is the power converter 3 (illustrated in FIG. 1) of the electric drive motor 4. In a braking mode (i.e., when the vehicle is being decelerated by the electric drive motor 4), the power converter 3 can itself become a generator, and feed current into the load circuit 5.

In practice, the use of a diode 6 in fuel cell systems 1 has two problems:

Firstly, a conductive connection has to be produced between the diode 6 and the fuel cell stack 2. This is usually achieved by means of a cable or a busbar, the cross section of which has to be designed for the high fuel cell currents. The connecting elements, for example in the form of a cable lug or a plug, also have to satisfy these requirements.

Secondly, the diode 6 has to be adequately cooled. This may be implemented by means of a suitable coolant, for example a water/antifreeze mixture or even air. Particularly when using water as the coolant, it is necessary to ensure that the coolant does not produce a conductive connection between the anode side and cathode side of the diode 6, which would deactivate the function of the diode 6. In the case of an air-cooled diode 6, a correspondingly large air heat sink and an associated fan have to be provided. Moreover, it must be ensured that dirt particles are not sucked in, which can combine with any water or condensation which may be present, leading to insulation problems on the planned leakage paths.

Figure 2:
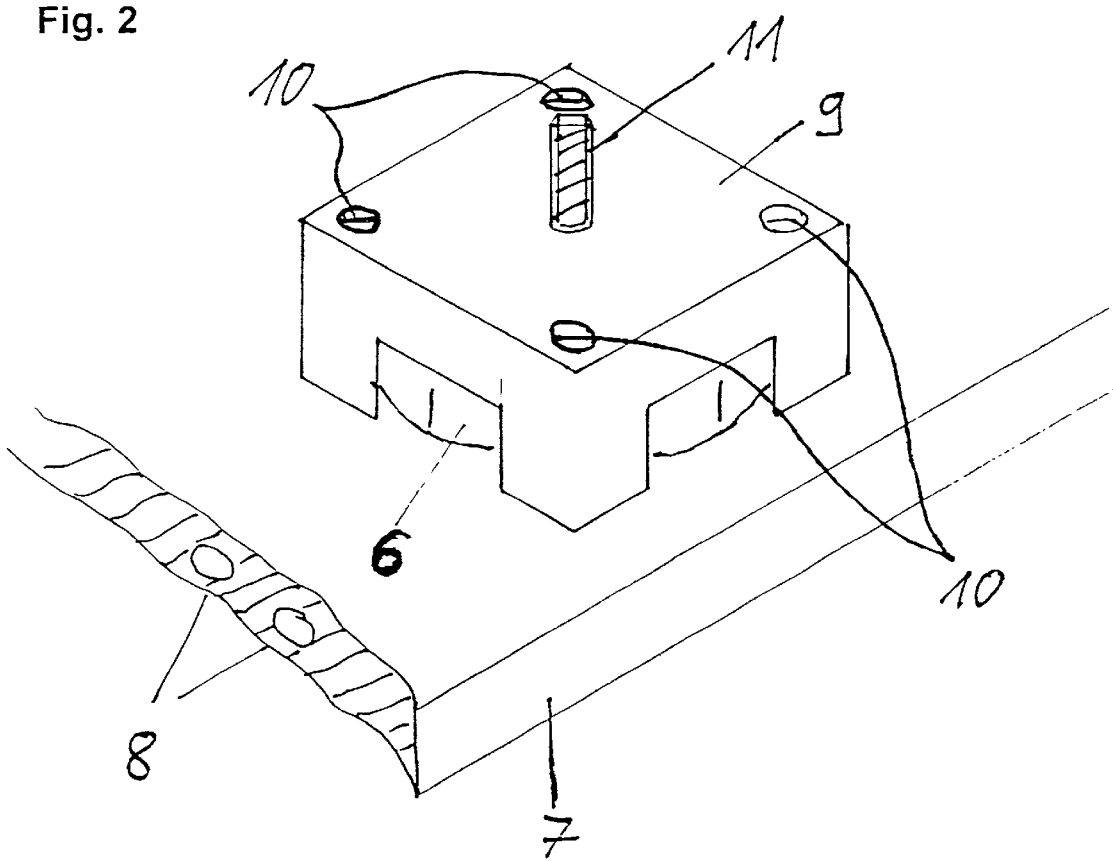
FIG. 2 is perspective view of a first exemplary embodiment of the invention.

According to the invention, these problems are solved by arranging the diode 6 on or in one of the end plates 7 of the fuel cell stack 2, with a cooling device 8, which is in thermal contact with the diode 6, being provided in the end plate 7, in the region of the diode 6. FIG. 2 shows a broken away view of a first exemplary embodiment of the invention, including end plates 7 of the fuel cell stack 2. The precise design of a fuel cell stack 2 and the way in which a fuel cell stack 2 of this type is delimited by means of two end plates 7 are known from the prior art and are therefore not described in more detail here.

A cooling device 8, (referred to below simply as a cooling duct) is provided in the end plate 7, in the region of the diode 6. A coolant flows through this cooling duct 8, which serves to absorb thermal energy from the end plate 7. The cooling device 8 must be designed in such a way that it can absorb the power loss from the diode 6. Two cooling ducts 8 are shown, the cooling duct 8 extending, by way of example, in the form of a loop through that region of the end plate 7 which is associated with the diode 6, so that it forms a feed and discharge line. Since the feed and discharge lines for the cooling ducts 8 of the fuel cell stack 2 usually run vertically through one or both end plates 7, it is also possible for the diode 6 to be arranged in the region of a feed or discharge line of this type, so that there is no need for an additional cooling duct 8. Naturally, other known cooling devices which are suitable for this application can also be used.

In principle, which of the two end plates 7 the diode 6 is arranged on makes no difference, since usually one end plate 7 is designed as the anode and the opposite end plate 7 is designed as the cathode of the fuel cell stack 2. It is therefore merely necessary to ensure the correct polarity of the diode 6.

The diode 6 may, for example, be in the form of a disc or a puck, connected to the end plate 7 with the aid of an attachment element 9, which is referred to below as a holder. The attachment is preferably removable, for example with the aid of screws 10. (The design of a diode 6 is explained in more detail below with reference to FIG. 3.) The holder 9 presses one of the poles of the diode 6 firmly onto the end plate 7, so that an electrically conductive connection is formed between diode 6 and fuel cell stack 2. To increase the pressure and therefore to reduce the junction resistance, elastic elements, which are not shown in more detail and are in the form, for example, of disc springs, may be provided in the holder 9. Additional electrical connectors, such as cables or busbars, between the diode 6 and the fuel cell stack 2 can therefore be eliminated. Furthermore, to improve the thermal and/or electrical conductivity, an intermediate layer of good thermal and/or electrical conductivity, for example an intermediate layer of copper or silver, may be provided between diode 6 and end plate 7.

An electrically conductive connection to the load circuit 5, for example in the form of a screw connection 11 or a plug for connection of a cable, is arranged on that pole of the diode 6 which is remote from the end plate 7. To prevent short-circuiting of the diode 6, the holder 9 may be made from an insulating material. Alternatively, an insulation layer (not shown) may be provided between the screw connection 11 and the holder 9.

The arrangement of the diode 6 according to the invention has the advantage that there is no need for electrical connectors between the diode 6 and the fuel cell stack 2, which represents a significant weight, volume and design advantage on account of the conductor cross sections which are required for the fuel cell currents. Furthermore, the direct electrical connection of the diode 6 to the end plate 7 obviates the need for electrical contact points which may lead to contact and insulation problems.

The fact that separate cooling for the diode is eliminated also represents a significant benefit in terms of weight, volume and design. The two-sided cooling of the diode 6 which is required in the case of air cooling or a high temperature difference between diode 6 and coolant can be reduced to single-side cooling by the end plate 7, since the liquid fuel cell coolant is able to dissipate more heat than an air cooling arrangement, and because the resistance to heat exchange through the end plate 7 is significantly lower than with an air heat sink.

Figure 3:
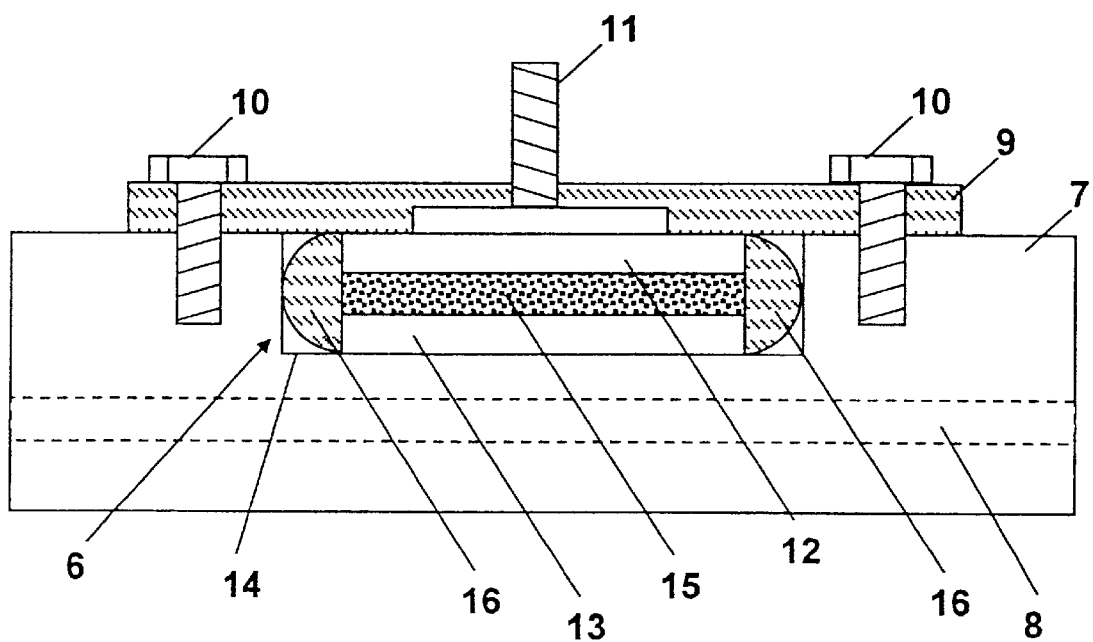
FIG. 3 shows a partial cross sectional view of a second exemplary embodiment of a fuel cell system.

FIG. 3 shows a further exemplary embodiment, partially in section, with parts which are identical to those shown in FIG. 2 having identical reference numerals. Unlike in FIG. 2, the diode 6 is not designed as a commercially available disc or puck, but rather the semiconductor chip of the diode 6, known as the pellet, is integrated directly in a recess 14 in the end plate 7. It is therefore possible to dispense with an additional housing for the diode 6, thus reducing manufacturing outlay during production. The diode, which is denoted overall by 6, comprises two opposite poles 12, 13, the actual barrier layer 15 of the diode 6 being arranged between the poles 12, 13. The two poles 12, 13 and the barrier layer 15 are held together by a circular insulating ring 16, which ensures electrical insulation between the poles 12 and 13 and between the pole 12 and the end plate 7.

The diode 6 is held in the recess 14 by means of a holder 9 which is made from an insulating material and is releasably attached to the end plate 7 by means of screws 10. At the same time, the pole 13 of the diode 6 is brought into intimate contact with the end plate 7. A screw connection 11 for releasably connecting the diode 6 to the load circuit 5 is provided on that pole 13 of the diode 6 which is remote from the end plate 7. Once again, a cooling duct 8 is provided in the end plate 7 in the region of the diode 6 in order to absorb the power loss from the diode 6.

As an alternative to using a holder 9, the diode may also be held in the recess 14 in some other way. By way of example, the diode 6 can be adhesively bonded into the recess 14 or can be held by a latching connection.

The arrangement illustrated in the second exemplary embodiment has the additional advantage that the electrical junction between the diode 6 and the fuel cell stack 2 is of lower resistance and therefore the electrical power loss is reduced. The more direct thermal coupling of the diode pellet to the cooling medium reduces the thermal resistance, which allows a higher coolant temperature or a higher barrier junction temperature in the diode 6. Furthermore, the improved electrical and thermal coupling of the diode 6 allows the barrier layer area to be reduced or, if the barrier layer area is kept constant, the electrical losses to be reduced.

Since, if the diode 6 is integrated directly in the end plate 7, the electrical leakage paths which are required can be designed to run in the radial direction with respect to the center point of the diode, a further benefit in terms of volume and design is achieved compared to leakage paths which run in the axial direction in the case of installation on the end plate 7.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A fuel cell system having a fuel cell stack with a plurality of fuel cells arranged between two end plates, and a load circuit, including a diode for connecting the fuel cell stack to an electrical load, wherein:
   the diode is arranged on or in a first one of said end plates; and
   a cooling device is provided in said first end plate in the region of and in thermal contact with, the diode.

2. The fuel cell system according to claim 1, wherein an intermediate layer, which is of large-area design and is at least one of thermally and electrically conductive, is arranged between diode and end plate.

3. The fuel cell system according to claim 1, wherein:
   an element is provided for attaching the diode to the first end plate; and
   the attachment element is removably connected to the end plate.

4. The fuel cell system according to claim 1, wherein a releasable connection for the load circuit is arranged on a pole of the diode which is remote from the first end plate.

5. The fuel cell system according to claim 1, wherein a semiconductor module of the diode is directly integrated in the first end plate.

6. The fuel cell system according to claim 1, wherein:
   the fuel cell stack has cooling ducts; and
   at least one cooling duct is arranged in the region of the diode.

7. A protective circuit for a fuel cell system which includes a stack of fuel cell units supported between end plates and connections for providing electric power to a load, said protective circuit comprising:
   a diode connected in series between said fuel cell system and said load; wherein
      said diode is arranged in thermal and electrical contact with a first one of said end plates; and
      a cooling device is provided in said first end plate in thermal contact with the diode.

8. A protective circuit according to claim 7, wherein the diode is removably mounted on a surface of said first end plate, by means of a holder.

9. A protective circuit according to claim 7, wherein the diode is removably inserted into a recess in said first end plate.

10. The fuel cell system according to claim 8 wherein:
    an element is provided for attaching the diode to the first end plate; and
    the attachment element is removably connected to the end plate.

11. The fuel cell system according to claim 9, wherein:
    an element is provided for attaching the diode to the first end plate; and
    the attachment element is removably connected to the end plate.

12. The fuel cell system according to claim 8, wherein a releasable connection for the load circuit is arranged on a pole of the diode which is remote from the first end plate.

13. The fuel cell system according to claim 9, wherein a releasable connection for the load circuit is arranged on a pole of the diode which is remote from the first end plate.

* * * * *